US006218656B1

(12) United States Patent
Guidash

(10) Patent No.: US 6,218,656 B1
(45) Date of Patent: Apr. 17, 2001

(54) PHOTODIODE ACTIVE PIXEL SENSOR WITH SHARED RESET SIGNAL ROW SELECT

(75) Inventor: Robert M. Guidash, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 09/223,608

(22) Filed: Dec. 30, 1998

(51) Int. Cl.$^7$ .............................. H04N 3/14; H01L 27/00
(52) U.S. Cl. ...................... 250/208.1; 257/291; 348/308
(58) Field of Search ........................... 250/208.1, 214.1; 257/291, 292, 443, 444, 431, 448; 348/300, 301, 308

(56) References Cited

U.S. PATENT DOCUMENTS

| 5,471,515 | 11/1995 | Fossum et al. | 377/60 |
| 5,587,596 | 12/1996 | Chi et al. | 257/223 |
| 5,608,243 | 3/1997 | Chi et al. | 257/249 |

(List continued on next page.)

OTHER PUBLICATIONS

"Active Pixel Sensors: Are CCD's Dinosaurs?" by Eric R. Fossum. Jet Propulsion Laboratory, California Institute of Technology. SPIE vol. 1900.
"A ¼ Inch 330k Square Pixel Progressive Scan CMOS Active Pixel Image Sensor" by Eiji Oba et al. 1997 IEEE International Solid–State Circuits Conference. Session 11, Paper FA 11.1.
"Technology and Device Scaling Considerations for CMOS Imagers" by Hon–Sum Wong. IEEE Transactions on Electron Devices, vol. 43, No. 12, Dec. 1996.

"128×128 CMOS Photodiode–Type Active Pixel Sensor with On–Chip Timing, Control and Signal Chain Electronics" by R.H. Nixon et al. Center for Space Microelectronic Technology, Jet Propulsion Laboratory—California Institute of Technology. Proceedings of the SPIE vol. 2415, Charge–Coupled Devices and Solid–State Optical Sensors V, paper 34 (1995).
"A Small Pixel CMD Image Sensor" by Masanori Ogata et al. IEEE Transactions on Electron Devices, vol. 38, No. 5, May 1991.
"A 250,000–Pixel Image Sensor with FET Amplification at EAch Pixel for High–Speed Television Cameras" by Fumihiko Andoh et al. 1990 IEEE International Solid–State Circuits Conference.
"An 800K–Pixel Color CMOS Sensor for Consumer Still Cameras" by J.E.D. Hurwitz et al. VLSI Vision Ltd.

Primary Examiner—John R. Lee
Assistant Examiner—Kevin Pyo
(74) Attorney, Agent, or Firm—Peyton C. Watkins

(57) ABSTRACT

An active pixel sensor having a plurality of pixels arranged in rows and columns that are read out of the active pixel sensor in a sequential order of rows with each of the pixels having a photodiode as the photodetecting element. The row that is currently being read has an amplifier within each of the pixel in that row operatively connected to a column signal bus by a reset transistor configuration. A floating diffusion within each pixel is operatively connected to the reset transistor within the pixel such that the reset gate on the reset transistor for the row of photodetectors that is currently being read is also connected to the drain of the next row of pixels to be read resulting in a configuration that allows selection and deselection of rows via the reset busses. During selection of a particular row the amplifiers within each pixel of that row are operatively connected to the column signal bus while the amplifiers of the remaining rows are deselected and not connected to the column signal bus.

12 Claims, 4 Drawing Sheets

U.S. PATENT DOCUMENTS

| | | | |
|---|---|---|---|
| 5,625,210 | 4/1997 | Lee et al. | 257/292 |
| 5,631,704 | 5/1997 | Dickinson et al. | 348/308 |
| 5,721,425 | 2/1998 | Merrill | 250/214.1 |
| 5,760,458 | 6/1998 | Bergemont et al. | 257/588 |
| 5,786,623 | 7/1998 | Bergemont et al. | 257/587 |
| 5,789,774 | 8/1998 | Merrill | 257/292 |
| 5,838,650 | 11/1998 | Campbell et al. | 369/103 |
| 5,847,422 | 12/1998 | Chi et al. | 257/291 |
| 5,881,184 * | 3/1999 | Guidash | 382/321 |
| 5,949,061 * | 9/1999 | Guidash et al. | 250/208.1 |

* cited by examiner

PHOTODIODE ACTIVE PIXEL SENSOR WITH SHARED RESET SIGNAL ROW SELECT

FIELD OF THE INVENTION

This invention relates to the field of solid state photosensors and imagers referred to as Active Pixel Sensors (APS) that have active circuit elements associated with each pixel, and more specifically to Solid State Imagers that employ photodiode type photodetectors 4 transistor pixels and correlated double sampling (CDS).

BACKGROUND OF THE INVENTION

APS are solid state imagers wherein each pixel contains the typical solid state pixel elements including a photo-sensing means, reset means, a charge to voltage conversion means, and additionally all or part of an amplifier. The photocharge collected within the pixel is converted to a corresponding voltage or current within the pixel as discussed in prior art documents such as "Active Pixel Sensors: Are CCD's Dinosaurs?", SPIE Vol. 1900-08-8194-1133 July 1993, by Eric Fossum. APS devices have been operated in a manner where each line or row of the imager is selected and then read out using a column select signal as discussed by E. Fossum in "Active Pixel Sensors: Are CCD's Dinosaurs?", SPIE Vol. 1900-08-8194-1133 July 1993 and by R. H. Nixon, S. E. Kemeny, C. O. Staller, and E. R. Fossum, in "128×128 CMOS Photodiode-type Active Pixel Sensor with On-chip Timing, Control and Signal Chain Electronics". Proceedings of the SPIE vol. 2415, Charge-Coupled Devices and Solid-State Optical Sensors V, paper 34 (1995). The selection of rows and columns within an Active Pixel Sensor is analogous to the selection of words and bits in memory devices. Here, the selection of an entire row would be analogous to selecting a word and the reading out of one of the columns of the Active Pixel Sensor would be analogous to selecting or enabling a single bit line within that word. Conventional prior art photodiode devices teach architectures employing 4 transistor designs, where the 4 transistors (4T) are typically the Transfer, Row Select, Reset, and Source Follower Amplifier transistors. While this architecture provides the advantages of yielding APS devices having the capability to easily perform CDS and provide low readout noise, these 4T pixels suffer from low fill factor. Fill factor is the percentage of pixel area that is devoted to the photosensor. Since these 4 transistors and their associated contact regions and signal busses are placed in each pixel, and since contact regions typically consume a large amount of pixel area due to the required overlap and spacings of various layers, the fill factor for the pixel is reduced because of the large area consumed that could otherwise be used for the photodetector. Connection to each of these components to the appropriate timing signal is done by metal busses that traverse the entire row of pixels. These metal busses are optically opaque and can occlude regions of the photodetector in order to fit them into the pixel pitch. This also reduces the fill factor of the pixel. Decreasing the fill factor reduces the sensitivity and saturation signal of the sensor. This adversely affects the photographic speed and dynamic range of the sensor, performance measures that are critical to obtaining good image quality.

Prior art devices employing 3 transistor (3T) based pixels have a higher fill factor than 4T pixels, but these 3T pixels cannot easily perform CDS. Sensors that perform CDS employing 3 transistor based pixels, typically first read out and store an image frame comprising a reset level for each pixel on the sensor. Next the signal frame is captured and read out. The reset level frame stored in memory must then be subtracted from the signal frame at each pixel to provide a pixel signal level that is referenced to the pixel reset level prior to integration. This requires an extra frame of memory in the imaging system, and an extra step in the digital signal processing chain, thus adversely affecting the speed, size and cost of the system.

A typical prior art Photodiode APS pixel is shown in FIG. 1. The pixel in FIG. 1 is a prior art 4 transistor pixel that comprises: a photodiode (PD), and transfer transistor (TG); floating diffusion (FD); reset transistor with a reset gate (RG); row select transistor with a row select gate, (RSG); a source follower input signal transistor (SIG); a row select signal buss (RSSB); a reset gate signal buss (RGSB), and a transfer gate signal buss (TGSB). 2 adjacent pixels are shown, each containing identical but separate transistors and row control signal busses for RG, TG and RSG. As stated above these 4 transistor pixels provide low readout noise with CDS by inclusion of an extra transistor per pixel. However the area required to implement the $4^{th}$ transistor reduces the fill factor of the pixel compared to the 3 transistor pixel.

It should be readily apparent that there remains a need within the art to provide an alternate pixel architecture that has higher fill factor, and the capability to perform CDS without the need to capture and store entire frames of image data.

SUMMARY OF THE INVENTION

The present invention provides a high fill factor Photodiode Active Pixel Architecture with the capability to perform Correlated Double Sampling, (CDS). The functionality of a 4 transistor pixel is maintained while eliminating the separate row select transistor. This is done by sharing the RG control signals in one row with the row select means of an adjacent row.

ADVANTAGEOUS EFFECT OF THE INVENTION

The present invention provides a Photodiode Active Pixel sensor with true Correlated Double Sampling (CDS), using only 3 transistors resulting in a higher fill factor. The advantage gained is high fill factor, and lower temporal noise. No disadvantages are foreseen.

DETAILED DESCRIPTION

Figure 2:
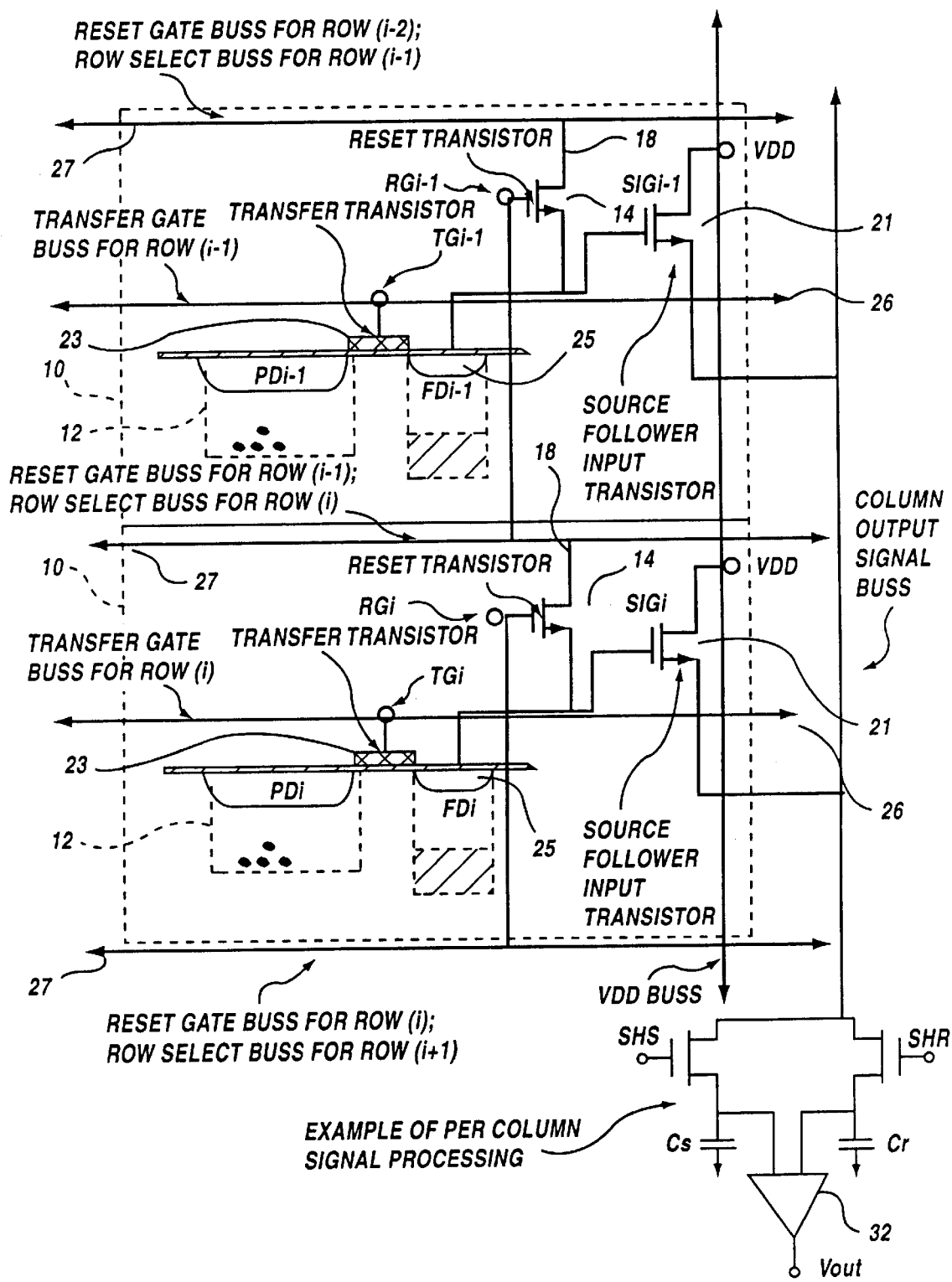
FIG. 2 is a schematic diagram of two adjacent pixels of a new Photodiode pixel architecture for an Active Pixel Sensor.

FIG. 2 is a schematic illustration of the 3 transistor photodiode pixel architecture for an Active Pixel Sensor (APS) as envisioned by the present invention. The preferred embodiment shown in FIG. 2 illustrates the best mode known to inventor. Other physical embodiments are realizable that are obvious variations of the embodiment shown in FIG. 2, as will be discussed further below. The pixels 10 shown in FIG. 2 are single pixels within an array of pixels having numerous rows and columns. The two row adjacent pixels 10 are shown in FIG. 2, to indicate how control the signal lines in one row are used for another purpose in an adjacent row. For the purpose of illustration of timing and operation, FIG. 2 also contains an example of per column analog signal processing used to read out the sensor. The per column signal processing referred to is the correlated double sampling that is performed under control of the Sample and Hold Signal (SHS) and Sample and Hold Reset (SHR) transistors that activate that sampling of the pixel signal voltage by the Signal Capacitor Cs and the pixel reset voltage by Reset Capacitor Cr.

Figure 1:
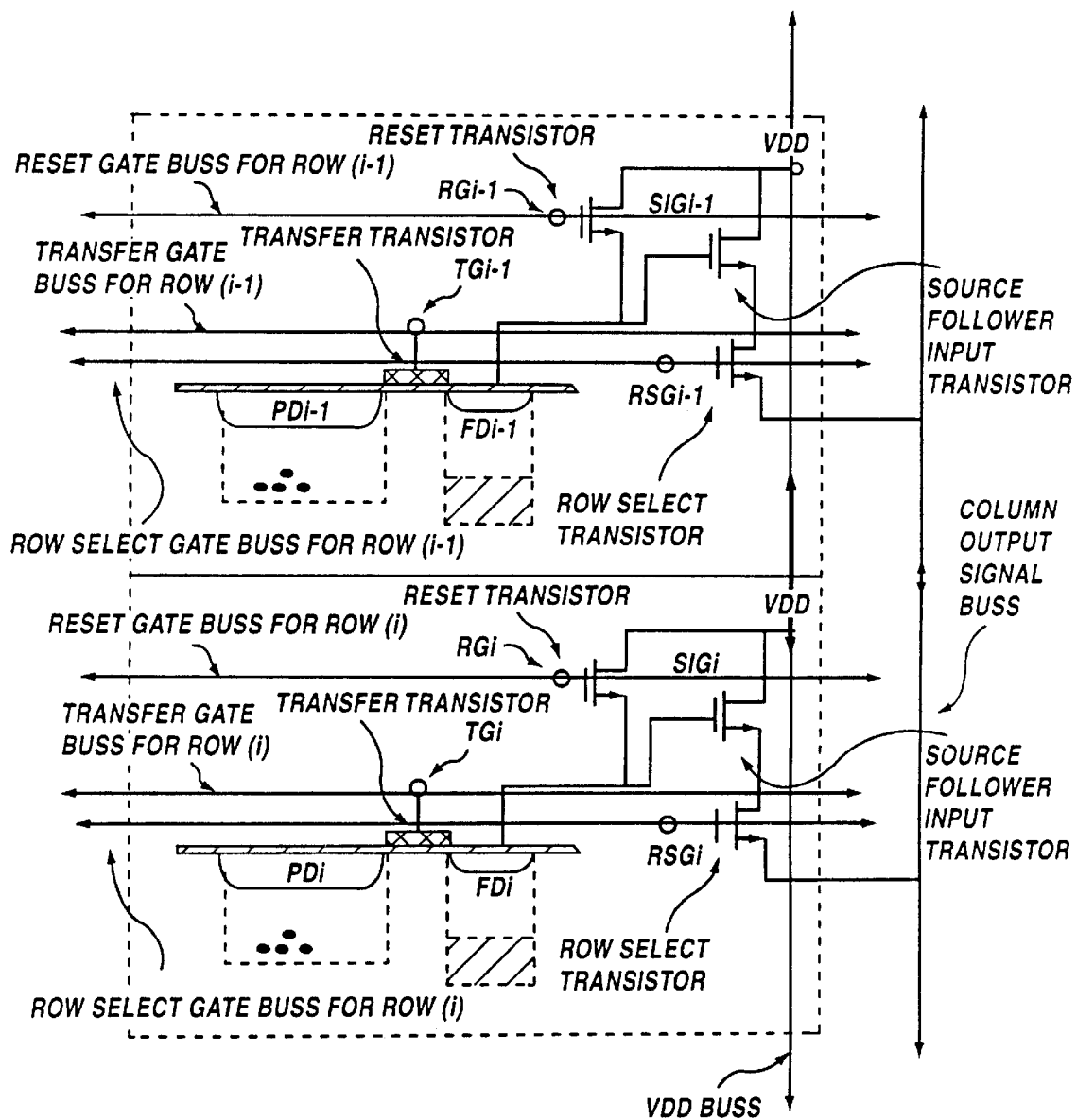
FIG. 1 is a schematic diagram of two adjacent pixels of prior art architecture for a four transistor Photodiode Active Pixel Sensor pixel.

As seen in FIG. 2, the pixel 10 comprises: a photodiode photodetector 12 (PD); transfer gate (TG) 23; floating diffusion (FD) 25; a reset transistor 14 with a reset gate 15 (RG); a reset drain 18 for the reset transistor 14; a source follower input signal transistor 21 (SIG); a transfer gate signal buss (TGSB) 26; and a reset gate signal buss (RGSB) 27. The row select and the row select signal buss of the prior art pixel shown in FIG. 1 is eliminated, and the row select process is accomplished in a novel manner discussed hereinbelow. As shown in FIG. 2, the reset gate signal buss (RGSB) 27 of any given row, referred to herein as $Row_i$, is connected to the reset drains 18 of the next row in the readout sequence, referred to herein as $Row_{i+1}$. The transistor, gate, and signal buss components within the 2 pixels have also been annotated with a subscript to indicate the row that they reside in.

Figure 3:
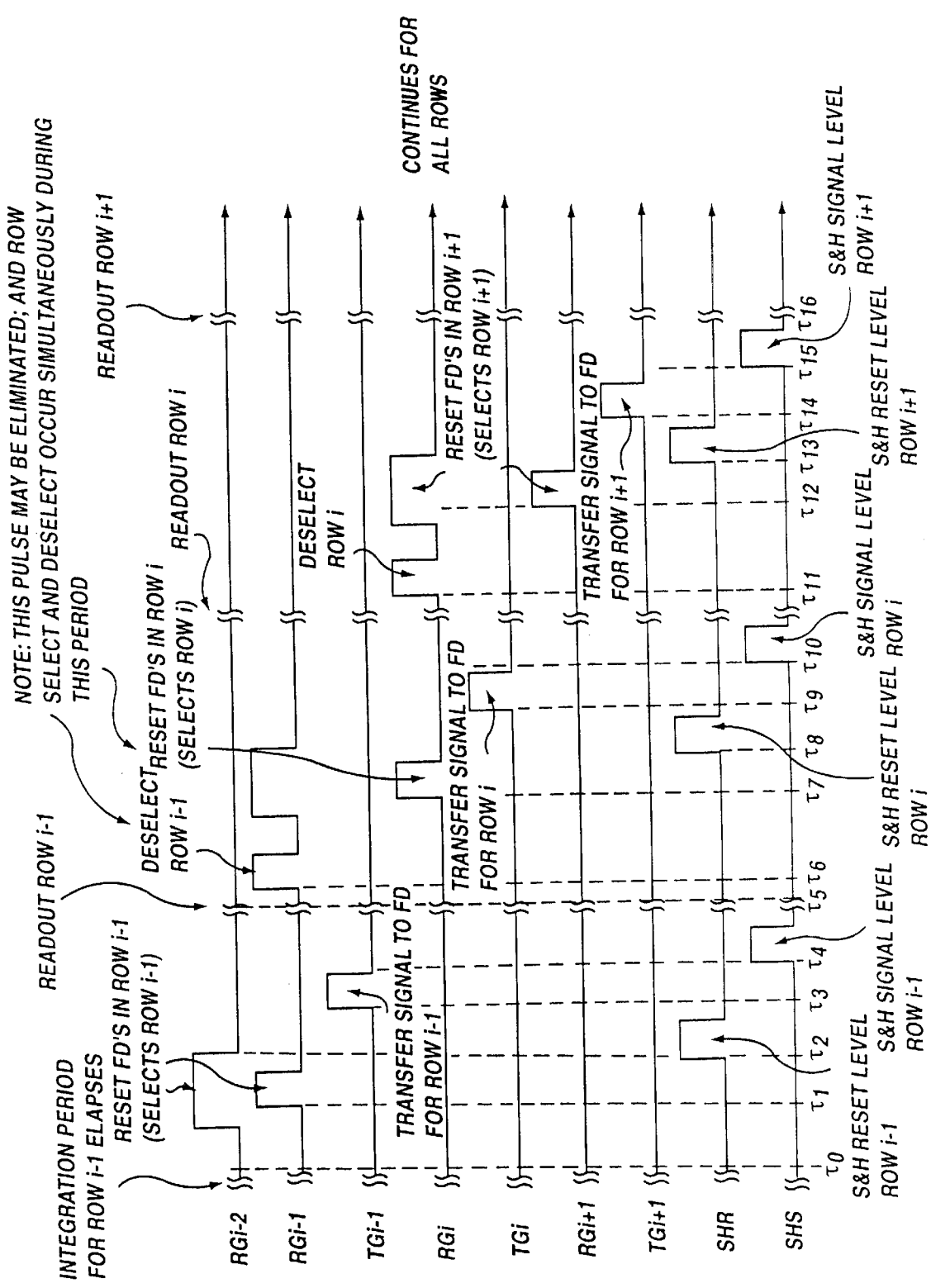
FIG. 3 is a timing diagram illustrating the operation of the pixels shown in FIG. 2.

Referring to FIG. 3, which is a timing diagram used to describe the operation of the 3 transistor pixels 10 shown in FIGS. 2, the operation of the new pixel architecture for FIGS. 2 will be described. It should also be understood that the pixel operation described takes place for an entire row of pixels 10 in the context of the standard per line rolling shutter operation of CMOS active pixel sensor devices. The diagram shows the timing sequence for the readout of 3 rows within the sensor; $Row_{i-1}$, $Row_i$, and $Row_{i+1}$. Each of the signals in the timing diagram have been annotated with a subscript indicating the row that they are associated with. It should be understood that the levels in the timing diagram are relative and can be set to be any predetermined signal level to provide optimized sensor performance.

The timing diagram begins at a point in time indicated as $\tau_0$, where the integration time for $Row_{i-1}$ has elapsed and the readout of $Row_{i-1}$ commences. $Row_{i-2}$ has been deselected, $RG_{i-2}$ and $RG_{i-1}$ are both high at time $\tau_1$ to reset the floating diffusions in $Row_{i-1}$ ($FD_{i-1}$) to ~VDD, or some other appropriate predetermined potential. The reset potential now turns on the source follower input transistors in $Row_{i-1}$ ($SIG_{i-1}$), effectively selecting that row for readout of the reset level of the floating diffusion which is sampled and held on Cr by pulsing SHR at time $\tau_2$. The transfer gates for $Row_{i-1}$ ($Tg_{i-1}$) are pulsed on at time $\tau_3$ to transfer the signal charge from the photodiodes in $Row_{i-1}$ onto the floating diffusions ($FD_{i-1}$) of $Row_{i-1}$. The signal levels of the floating diffusions in $Row_{i-1}$ ($FD_{i-1}$) are still at a level that effectively selects $Row_{i-1}$ for readout and the signal levels of these floating diffusions ($FD_{i-1}$) of $Row_{i-1}$ are then sampled and held on Cs by pulsing SHS at time $\tau_4$. Each column in $Row_{i-1}$ is then readout differentially through the per column difference amplifier 32 in the period indicated in the timing diagram by "Readout $Row_{i-1}$" at time $\tau_5$.

Following the readout of $Row_{i-1}$, $Row_{i-1}$ is deselected by pulsing $RG_{i-1}$ on while leaving $RG_{i-1}$ low at time $\tau_6$. This sets the voltage of the floating diffusions for $Row_{i-1}$ ($FD_{i-1}$) to a level that shuts off the source follower transistors for $Row_{i-1}$ ($SIG_{i-1}$), effectively disconnecting the source followers for $Row_{i-1}$ from the output signal column buss, thus deselecting $Row_{i-1}$. Next $Row_i$ is selected by pulsing on $RG_i$ while $RG_{i-1}$ is held high at time $\tau_7$. It should be noted that the re-pulsing of $RG_{i-1}$ at time $\tau_7$ simply resets the floating diffusions for the previous row that was read ($FD_{i-1}$) to a low voltage, keeping the source follower signal transistors for that row ($SIG_{i-1}$) in a non-enabled state, effectively disconnecting the floating diffusions for the row that was previously read ($FD_{i-1}$) and prevents it from interfering with the output of the current row being read, in this case $ROW_i$. The reset level of the floating diffusions for $ROW_i(Fd_i)$, are sampled and held by pulsing SHR at time $\tau_8$. $TG_i$ is then pulsed "high" to transfer the signal charge from the photodiodes for $ROW_i(Pd_i)$ to the floating diffusions for $ROW_i$ ($FD_i$) at time $\tau_9$, and the signal level is sampled and held by pulsing SHS at time $\tau_{10}$. Readout of $Row_i$ is then completed similarly to $Row_{i-1}$.

This process described for $ROW_{i-1}$ and $ROW_i$ is repeated for $Row_{i+1}$. $Row_i$ is deselected by setting the $FD_i$ to a low voltage level at $\tau_{11}$ by pulsing $RG_i$ "high" while $RG_{i-1}$ is held low disabling the source follower transistor for $ROW_i$. $Row_{i+1}$ is reset, which operates to select $Row_{i+1}$ at time $\tau_{12}$ because $Rg_i$ is "high" at that time and $Row_{i+1}$ is effectively selected with all other rows deselected; the reset level is sampled and held at time $\tau_{13}$ by activating SHR; the signal level is transferred from $PD_{i+1}$ to $FD_{i+1}$ at time $\tau_{14}$ by $TG_{i+1}$; the signal level is then sampled and held at $\tau_{15}$; and the $Row_{i+1}$ readout occurs at time $\tau_{16}$ as previously described.

This process repeats for all rows of the sensor until the entire frame or sequence of frame readouts is complete. It should be noted that the row select and deselect process could also be combined by eliminating the first of the 2 RG pulses and having enough overlap of the adjacent RG signals as indicated in FIG. 3. The timing illustrated by FIG. 3 is that which the inventor believes that best mode operating the invention.

From the description of operation provided it is evident that this new 3 transistor photodiode pixel architecture provides true CDS output signal without the need for storing a reset frame.

The typical prior art Photodiode APS pixel shown in FIG. 1 comprised 4 transistors, and 3 row control signal busses. By comparison the new pixel architecture in FIG. 2 comprises only 3 transistors and 2 row control signal busses. The elimination of 1 transistor and buss and the associated contact regions provides more pixel area that can be allocated to the photodetector. This provides substantially higher pixel fill factor and consequently higher optical sensitivity.

Figure 4:
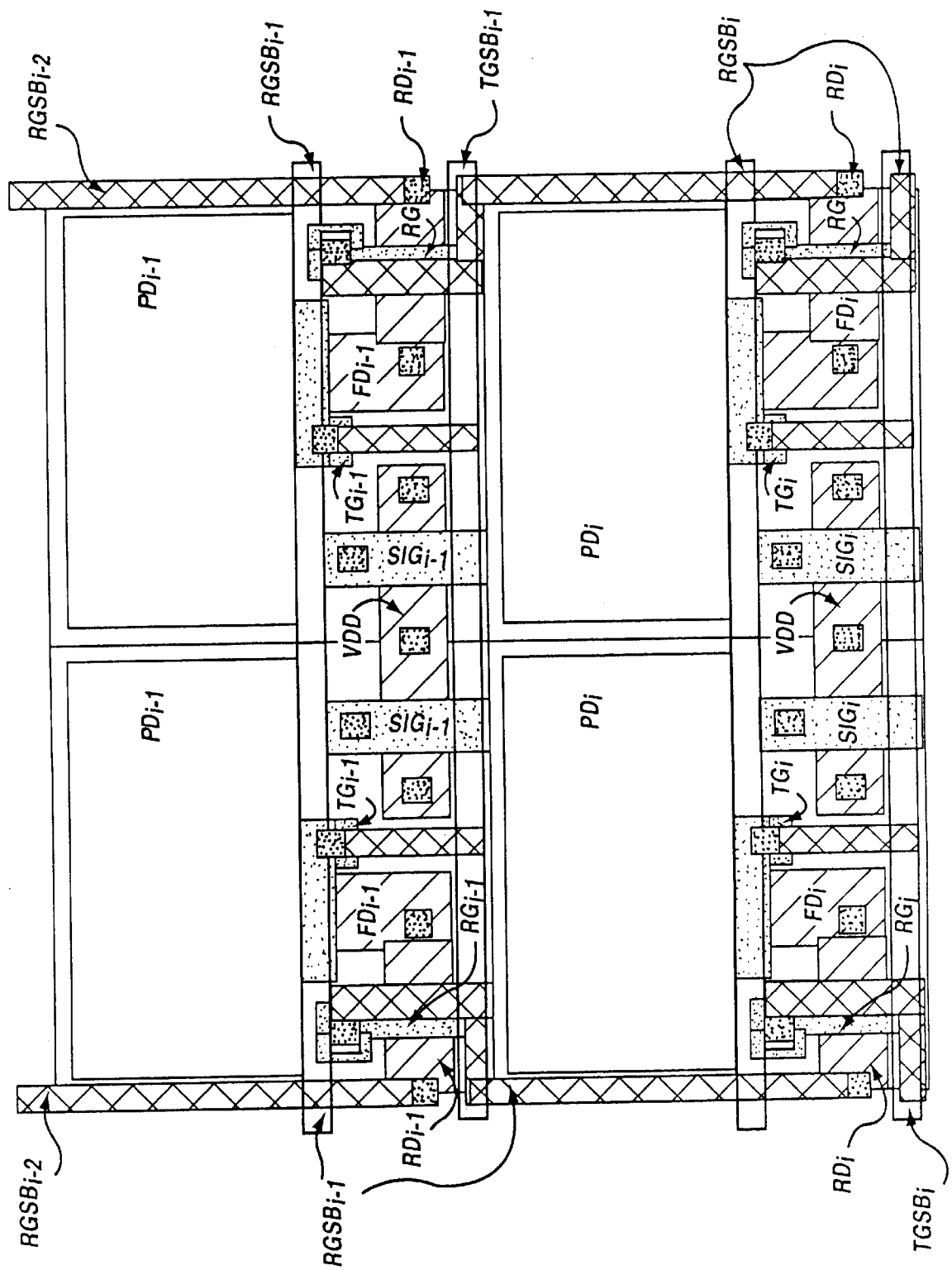
FIG. 4 is a top view layout of the pixel shown in FIG. 2.

FIG. 4 is a top view of the new pixel architecture as discussed above shown to further illustrate the concept of the present invention. In FIG. 4 the gate of the reset transistor in $ROW_{i-1}(RG_{i-1})$ is the reset drain for the reset transistor of the next row to be read out in sequence, $ROW_i$.

The foregoing description details the embodiments most preferred by the inventor. Variations of these embodiments will be readily apparent to those skilled in the art. Accordingly, the scope of the invention should be measured by the appended claims.

PARTS LIST 10 pixel
12 photodiode
14 reset transistor 15 reset gate
18 reset drain
21 source follower input transistor
23 transfer gate
25 floating diffusion
26 transfer gate signal bus
27 row select and photogate signal buss
32 difference amplifier
SHS sample and hold signal transistor
CS signal storage capacitor
SHR sample and hold reset transistor
CR reset storage capacitor

What is claimed is:

1. An active pixel sensor having a plurality of pixels arranged in rows and columns that are read out of the active pixel sensor in a sequential order of rows with at least a plurality of the pixels comprising:

a photodiode photodetector in the row currently being read that is operatively connected to a charge to voltage conversion node;

a reset transistor associated with the same pixel as the photodiode photodetector that has a source that is connected to the charge to voltage conversion node;

a reset gate on the reset transistor connected to a present reset control buss and a drain on the reset transistor connected to a prior reset control buss of the row previously read;

an amplifier operatively connected to the charge to voltage conversion node.

2. The invention of claim 1 wherein the source of the reset transistor is also the voltage conversion node.

3. The invention of claim 1 wherein the charge to voltage conversion node is a floating diffusion.

4. The invention of claim 1 wherein the amplifier is a source follower amplifier.

5. The invention of claim 1 wherein application of a first predetermined signal to the prior reset control buss connected to the present reset drain and, and a second predetermined signal to the present reset control buss resets the charge to voltage conversion nodes of the row presently being read.

6. The invention of claim 5 wherein the process of resetting the charge to voltage conversion node also selects the row presently being read.

7. The invention of claim 5 further comprising:

an output signal column buss for each of the columns that is operatively connected to the amplifiers for photodetectors in that column; and the application of the first and second predetermined signals connects the amplifiers of the row currently being read to the output signal column buss.

8. The invention of claim 1 wherein application of a first predetermined signal to the prior reset control buss connected to the present reset drain and, and a second predetermined signal to the present reset control buss sets the charge to voltage conversion node to a predetermined potential that disables the amplifiers of the row previously read.

9. The invention of claim 8 wherein the process of disabling the row previously read deselects the row previously read.

10. The invention of claim 8 further comprising:

an output signal column buss for each of the columns that is operatively connected to the amplifiers for photodetectors in that column; and the application of the first and second predetermined signals disconnects the amplifier of the row previously read from the output signal column buss.

11. A method of forming an active pixel sensor comprising the steps of:

providing a semiconductor substrate having a plurality of pixels arranged in rows and columns such that the rows can be read out sequentially; and creating at least a portion of the pixels such that there is a present reset buss and a prior reset buss that are associated with at least one designated row within the portion and are operative in a first combination to reset the pixels in the designated row which results in selection of the designated row to be read and operative in a second combination to deselect the pixels in the designated row subsequent to the designated row being read.

12. The method of claim 11 wherein the step of creating further comprises:

creating the portion wherein each of the pixels in the designated row have an amplifier that as a first result of the first combination the amplifier is connected to a column buss; and as a second result of the second combination the pixels in the designated row do not have their amplifiers connected to the column buss.

* * * * *